United States Patent
Ripoll et al.

(10) Patent No.: US 9,594,102 B2
(45) Date of Patent: Mar. 14, 2017

(54) DEVICE FOR MEASURING GROUND CONNECTION RESISTANCE AND ONBOARD CHARGER FOR A VEHICLE PROVIDED WITH SUCH A DEVICE

(71) Applicant: RENAULT S.A.S., Boulogne-Billancourt (FR)

(72) Inventors: Christophe Ripoll, Chevreuse (FR); Christophe Konate, Massy (FR); Etienne Cuiller, Maurepas (FR)

(73) Assignee: RENAULT s.a.s., Boulogne-billancourt (FR)

(*) Notice: Subject to any disclaimer, the term of this patent is extended or adjusted under 35 U.S.C. 154(b) by 161 days.

(21) Appl. No.: 14/409,765

(22) PCT Filed: Jun. 6, 2013

(86) PCT No.: PCT/FR2013/051293
§ 371 (c)(1),
(2) Date: Dec. 19, 2014

(87) PCT Pub. No.: WO2013/190207
PCT Pub. Date: Dec. 27, 2013

(65) Prior Publication Data
US 2015/0198644 A1 Jul. 16, 2015

Related U.S. Application Data

(60) Provisional application No. 61/663,013, filed on Jun. 22, 2012.

(30) Foreign Application Priority Data

Jun. 20, 2012 (FR) ..................... 12 55793

(51) Int. Cl.
H02J 7/00 (2006.01)
G01R 27/20 (2006.01)
B60L 3/00 (2006.01)
B60L 11/18 (2006.01)

(52) U.S. Cl.
CPC .......... *G01R 27/205* (2013.01); *B60L 3/0069* (2013.01); *B60L 11/1816* (2013.01); *B60L 11/1818* (2013.01); *G01R 27/20* (2013.01); *B60L 2210/30* (2013.01); *B60L 2240/547* (2013.01); *B60L 2240/549* (2013.01); *Y02T 10/7005* (2013.01); *Y02T 10/7072* (2013.01); *Y02T 10/7241* (2013.01); *Y02T 90/127* (2013.01); *Y02T 90/14* (2013.01)

(58) Field of Classification Search
CPC ... Y02T 90/14; Y02T 10/7005; Y02T 90/128; Y02T 10/7088; Y02T 90/163
USPC .......................................... 320/109
See application file for complete search history.

(56) References Cited

U.S. PATENT DOCUMENTS

| | | | |
|---|---|---|---|
| 7,235,900 B1 * | 6/2007 | Couture | H02G 7/20 219/482 |
| 2007/0170910 A1 * | 7/2007 | Chang | H01C 1/16 333/172 |
| 2009/0278547 A1 * | 11/2009 | Acena | G01R 31/025 324/509 |
| 2010/0244849 A1 * | 9/2010 | Yano | G01R 31/025 324/510 |
| 2011/0029146 A1 * | 2/2011 | Muller | B60L 11/1816 700/293 |

FOREIGN PATENT DOCUMENTS

| | | |
|---|---|---|
| GE | P2012 5544 B | 5/2012 |
| JP | 2009-207286 A | 9/2009 |
| JP | 2010-205569 A | 9/2010 |

OTHER PUBLICATIONS

U.S. Appl. No. 14/401,436, filed Nov. 14, 2014, Merienne.
International Search Report issued Nov. 20, 2013 in PCT/FR2013/051293 filed Jun. 6, 2013.
Preliminary Search Report issued Feb. 26, 2013 in French Patent Application No. FR 1255793 filed Jun. 20, 2012.

* cited by examiner

Primary Examiner — Arun Williams
(74) Attorney, Agent, or Firm — Oblon, McClelland, Maier & Neustadt, L.L.P.

(57) ABSTRACT

A device for measuring resistance of a ground tap and a charger for an on-board vehicle including the device. The device includes a current source and an ammeter disposed on a first electrical branch, provided to link a phase of a power supply network with the ground of the installation; a second electrical branch provided to link a neutral wire of the power supply network with the ground of the installation, including a resistor across terminals of which is connected a voltmeter, and a first capacitor in series with the resistor; and a third electrical branch is provided for linking the neutral wire of the network with the ground of the installation, and including, on the third branch, in parallel with the first capacitor and with the first resistor, a second capacitor of higher value than the first capacitor.

10 Claims, 3 Drawing Sheets

Figure 1:
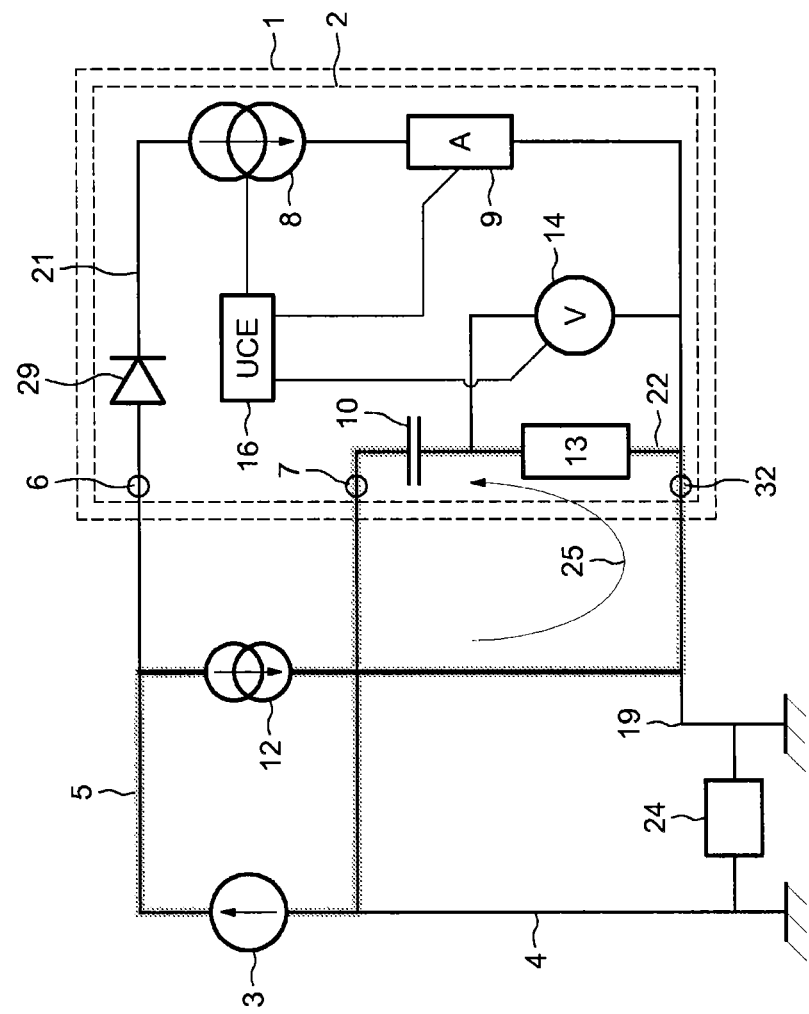

000
DEVICE FOR MEASURING GROUND CONNECTION RESISTANCE AND ONBOARD CHARGER FOR A VEHICLE PROVIDED WITH SUCH A DEVICE

The subject matter of the invention relates to devices for measuring ground connection resistance, and in particular devices for measuring ground connection resistance integrated into a battery charger on board a vehicle.

The current intensities used when charging a battery intended for the propulsion of an electric vehicle are particularly high.

For safety reasons, it is therefore necessary, before starting to charge the battery, to check that the grounding of the charger is sufficiently effective, in order to protect, in case of current leakage, persons coming into contact with the vehicle.

Devices exist for measuring ground connection resistance. They typically include a first electrical branch provided with a current generator and an ammeter, and that is connected onto a phase of the electrical network. They further include a second branch on which are placed a capacitor and a resistor, provided with a voltmeter, a branch that is connected onto a neutral wire of the electrical network.

Measuring ground resistance should normally be done without any electrical appliance connected to the network, other than the device for measuring the ground connection. If another appliance is connected to the network, it can create current loop interference that might alter the result of the measurement.

The object of the invention is to provide a device for measuring ground connection resistance that preserves good measurement accuracy while having a reduced sensitivity to the interference currents generated by possible appliances connected to the power supply network used.

To this end, the invention provides a device for measuring a ground resistance of an apparatus, including:

a current source and an ammeter arranged on a first branch, provided for connecting a phase of a power supply network with the ground of the apparatus, a second branch provided for connecting a neutral wire of the power supply network with the ground of the apparatus, comprising a resistor at the terminals of which a voltmeter is connected, and comprising a first capacitor in series with the resistor.

The device comprises a third branch provided for connecting the neutral wire of the network with the ground of the apparatus, and comprises, in parallel with the first capacitor and the first resistor, a second capacitor of higher value than the first capacitor.

An inductor may be placed in series with the resistor and with the first capacitor, parallel to the second capacitor.

Advantageously, the second capacitor is at least five times greater than the first capacitor, and preferably at least ten times greater than the first capacitor.

The second capacitor may have a value between 10 and 100 nF (nanofarads), and preferably between 20 and 300 nF.

The inductor may have a value between 1 and 10 mH (millihenries).

The invention also provides a charger for a motor vehicle battery, including the ground connection measuring device described.

The charger may include a relay capable of connecting the second branch alternately to a first connecting terminal of the charger power supply, and a second connecting terminal of the charger power supply, distinct from the first terminal.

The charger may also include a second voltmeter (15) connected between the ground connection terminal and the second terminal so that it can be disconnected by the relay, and include a third voltmeter connected between the ground connection terminal and the first terminal so that it can be disconnected by the relay.

According to a preferred embodiment, the first branch and the second branch may be connected respectively to a first input terminal of the device and to a second input terminal of the device, or on the contrary be connected respectively to the second and to the first terminal, using the same mechanical switch comprising split connections either on the side of the connecting terminals, or at the ends of the first and the second electrical branch, and comprising two contactors each capable of switching, simultaneously, one from the first to the second, and the other from the second to the first of the split ends.

The charger may include an electronic control unit configured, when the terminals are connected onto a power supply network, for switching the relay so that the second branch is connected to that of the two terminals for which the voltage at the terminals of the second capacitor is the lowest.

The electronic control unit may be configured for preventing the charging of a battery following an attempt to connect to a power supply network, if the voltage measured at the terminals of the resistor remains higher than a threshold voltage after activation of the relay.

The electronic control unit may be configured for preventing the charging of a battery if a ground resistance calculated from the readings of the ammeter and the first voltmeter is greater than or equal to a threshold resistance.

Figure 2:
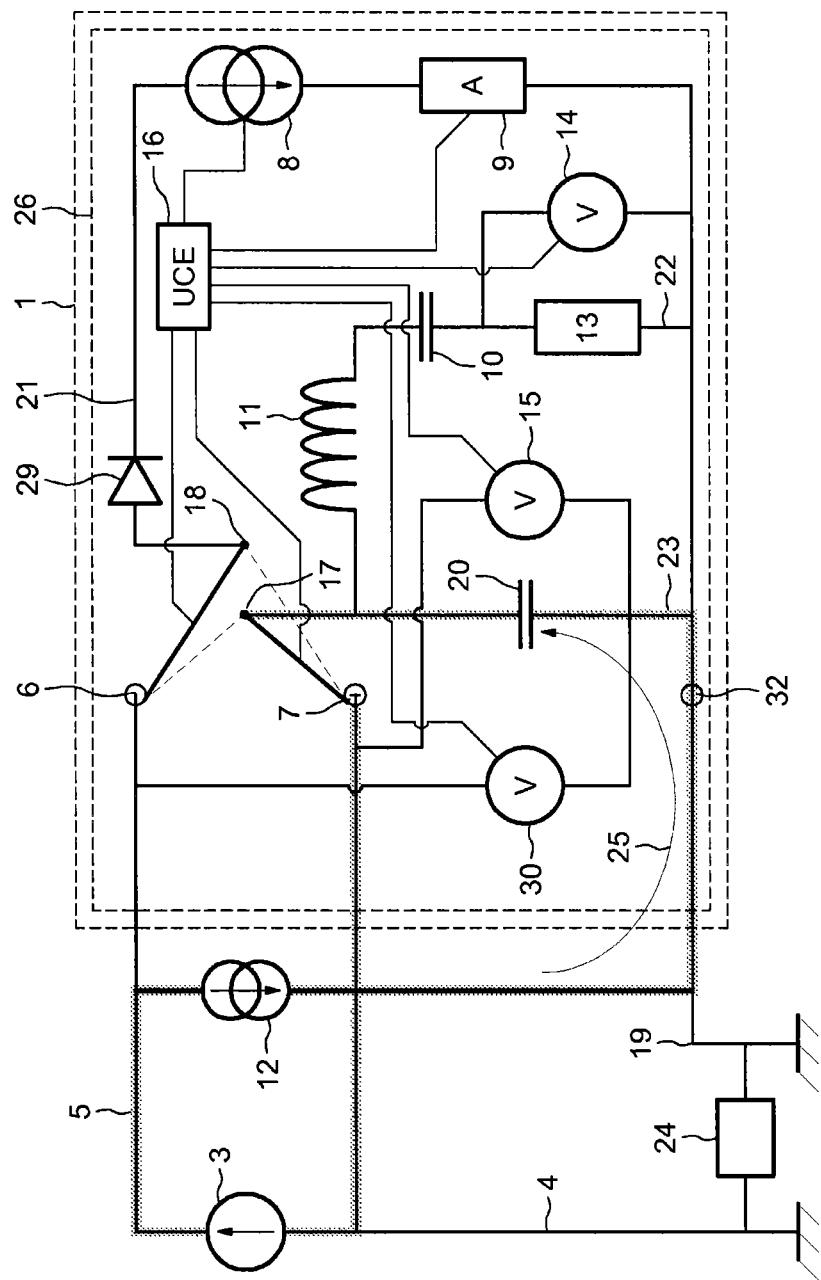
Figure 3:
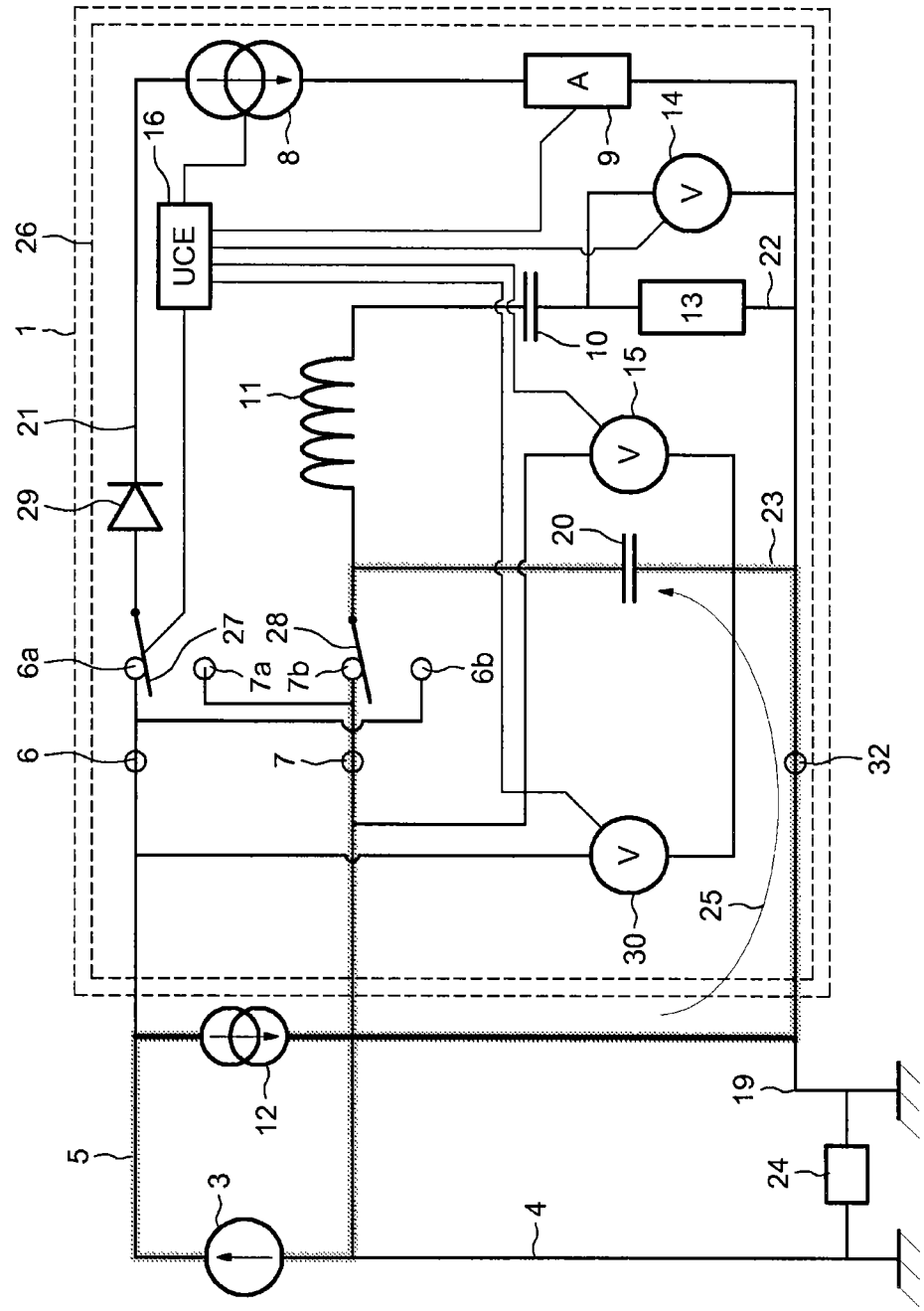

Other objects, features and advantages of the invention will appear on reading the following description, given solely by way of non-restrictive example and referring to the attached drawings, in which:

FIG. 1 is a schematic representation of a device for measuring ground resistance according to the prior art, FIG. 2 is a schematic representation of a device for measuring ground resistance according to the invention, and FIG. 3 is a schematic representation of another device for measuring ground resistance according to the invention.

As illustrated in FIG. 1, a battery charger 1 on board on a vehicle includes a device for measuring ground resistance 2. The charger 1 includes a first connecting terminal 6 and a second connecting terminal 7 that are geometrically configured for being inserted, the first into a power outlet plug connected to a phase wire 5 of an electrical network 3, the second into a plug connected to a neutral wire 4 of the same electrical network.

The electrical network is schematically symbolized here by a voltage source 3.

The charger 1 also includes a ground terminal 32 configured so as to be able to be placed in electrical contact with a ground wire 19 of the electrical network.

The measuring device 2 includes a first electrical branch 21 connecting the first terminal 6 and the ground connection terminal 32. Arranged on this branch 21 is a current generator 8 fitted in series with an ammeter 9 and with a diode 29 configured for allowing the electrical current of the network only to pass in the same direction as the current injected by the current generator 8.

The device for measuring ground resistance 2 further includes a second electrical branch 22 connecting the second connecting terminal 7 with the ground connection terminal 32. Arranged in series on this second branch are a first capacitor 10 and a resistor 13, at the terminals of which a first voltmeter 14 is connected. An electronic control unit 16 is connected to the voltmeter 14 and to the ammeter 9 in order to be able to collect the values measured by the voltmeter and the ammeter. The electronic control unit 16 is also connected to the current generator 8 so as to be able to inject a current into the first branch 21 of the measuring device 2.

The current injection by the generator 8 into the second branch causes a return current via the ground connection 32 to the neutral 4 of the electrical network 3, and a parallel current loop passing through the resistor 13.

An electrical resistance 24 can be measured opposing the current flow between the ground connection 19 and the neutral 4 of the network. This resistance 24 is the ground resistance to be measured using the device 2.

Known measuring procedures enable the electronic control unit 16, based on values delivered by the ammeter 9 and the voltmeter 14, to deduce the value of the ground resistance 24. For example, it can be considered as a first approximation that the ground connection resistance 24 has a value of $R_T$, with:

$R_T=V/A$, where V is a voltage measured by the first voltmeter 14, and A is the intensity of the current measured at the same time by the ammeter 9, in particular if the value $R_T$ thus determined is substantially less than the value of the resistor 13.

However, if the measurement is made while an interfering electrical appliance 12 is connected on the same electrical network 3, this interfering appliance 12 may send a parasitic current to the ground connection 19 and generate a parasitic current loop 25—represented in FIG. 1 using a thickened line and an arrow indicating the current flow. This parasitic current loop 25 passes through the resistor 13 and then modifies the results of ground resistance measurements performed by the electronic control unit 16.

FIG. 2 depicts a charger 1 provided with a device for measuring resistance 26 according to the invention.

Some elements found in FIG. 2 are common to the device for measuring ground connection resistance 2 in FIG. 1, the same elements being designated by the same references.

The measuring device 26 comprises a third branch 23 connecting the second terminal 7 and the ground connection terminal 32.

A capacitor 20 with a value greater than the capacitor 10 is placed on this branch. A second voltmeter 15 may be connected between the ground connection terminal 32 and the first connecting terminal 6 of the charger. A third voltmeter 30 may be connected between the ground connection terminal 32 and the second connecting terminal 7 of the charger.

The second branch 22 may remain identical to that described for the device 2 in FIG. 1, or may comprise an inductor 11 placed in series with the first capacitor 10.

The value of the capacitor 20 is chosen so as to be substantially greater, e.g. ten times greater, than the capacitor 10 of the second branch. In this way, the parasitic currents generated by the interferer 12, which are generally of higher frequency than the frequencies used for measuring ground connection resistance, and which are generally of higher frequency than the frequency of the electrical network, 'see' a lower impedance at the level of the capacitor 20 than the impedance of the second branch. This difference of impedance diverts the parasitic current loop 25 toward the third branch and prevents these parasitic currents from interfering with the measuring currents flowing through the second branch of the device 26.

The interference currents generated by household appliances may typically have a frequency of the order of a kilohertz, compared with the 50 hertz delivered by the electrical network. The inductor 11 can be used to increase the impedance 'seen' by the parasitic currents on the second branch 22 of the device 26.

For such current frequencies, a capacitor may advantageously be chosen having a value between 10 and 100 nF (nanofarads), and preferably between 20 and 300 nF.

The inductor may have a value between 1 and 10 mH (millihenries). It may be zero in the variant embodiment without additional inductance.

The procedure for measuring ground resistance as performed by the electronic control unit 16 remains essentially unchanged.

The device for measuring ground connection resistance 26 may further comprise a relay system at the level of the connecting terminals 6 and 7, in order to ensure that the first branch is properly connected to a phase wire 5 of the network and that the second branch 22 is properly connected to the neutral wire 4 of the network 3.

A first relay 17 may, for example, be capable of switching the connection of the second branch 22 alternately to the first physical terminal 6 and to the second physical terminal 7.

A second relay 18 may be capable of switching the connection of the first branch 21 alternately to the first physical terminal 6 and to the second physical terminal 7.

The measurements performed by the voltmeters 15 and 30 can be used to check the position of the neutral 4, then after these measurements have been performed, to connect the second branch 22 and the third branch 23 to the neutral 4, and to connect the first branch 21 to the phase 5.

Thus it is ensured that the second branch 22 is properly connected to the neutral wire 4 of the network 3. The electronic control unit 16 can then switch the second relay 18, from a position where it is in contact with neither terminal 7 nor terminal 6, so as to place it in contact with the terminal left available by the first relay 17.

FIG. 3 depicts a variant embodiment of the charger in FIG. 2. In this variant embodiment, the connections to the network of the first and second branches are made using a double action switch including a first contactor 27 and a second contactor 28 operated simultaneously by the electronic control unit 16. Terminal 6 and terminal 7 of the charger 1 are each split, respectively into two contact points 6a, 6b for terminal 6 and into two contact points 7a, 7b for terminal 7. Contact points 6a, 6b are located, for example, outside contact points 7a, 7b. The first contactor 27 connected to the first branch 21 is capable of switching from contact 6a to contact 7a and the second contactor is capable of switching simultaneously from contact 7b to contact 6b.

When the first contactor 27 is in contact with contact 6a, the second contactor 28 is in contact with contact 7b. It is then considered that terminal 6 is connected to a phase of the network as illustrated in FIG. 1, and terminal 7 is connected onto the neutral wire 4 of the network.

When terminal 6 is connected onto the neutral wire of the network and terminal 7 onto a phase of the network (configuration not shown in the figures), the electronic control unit 16 switches the contactor 27 so that it comes into contact with contact 7a. The contactor 28 then switches simultaneously with contact 6b, for example, owing to a mechanical link connecting the two contactors. The first branch 21 is thus connected to the phase 5 and the second branch 22 connected to the neutral 4.

According to a variant embodiment, the connections may be split on the side of the first 21 and the second 22 electrical branches, instead of being split at the connecting terminals 6 and 7. In a similar way to the embodiment in FIG. 2, two voltmeters 15 and 30 placed upstream of the contactors enable the electronic control unit 16 to connect the first branch 21 onto the phase 5 of the network, and to connect the second branch 22 onto the neutral 4 of the network.

The electronic control unit 16 may be configured for preventing the use of the charger, if after attempting to correctly connect the first and second branches respectively to the phase and to the neutral of the network, the voltage measured by the voltmeter 14 remains higher than a preselected threshold. This abnormal voltage may, for example, be due to a failure of the system of contactors 17-18 or 27-28, which remains stuck in the reverse configuration of the one desired with respect to the geometric configuration of the electrical plug used for connecting the charger 14 to the network 3.

The electronic control unit 16 may also be configured for preventing the use of the charger if the ground connection resistance is higher than a determined threshold, for example, higher than a hundred ohms, or failing this for a ground resistance higher than 200 ohms.

The device for measuring ground connection resistance according to the invention can be used both to improve safety, by reliably monitoring the grounding resistance value of the apparatus, and to ensure the correct connection of the device, in order to prevent, if the phase and neutral wires of the apparatus are switched, connecting the phase wire directly onto the third branch of the device, which could risk sending unwanted current intensities to the vehicle's ground.

The invention is not limited to the examples of embodiment described and may have many variants.

The device for measuring ground connection 26 may lack connections with variable geometry that can be used to switch the phase and neutral.

The device may be designed for being connected onto a single-phase, two-phase or three-phase network, provided that the apparatus comprises at least one phase wire, a neutral wire and a corresponding wire for grounding.

The device can then be connected between one of the phase wires and the neutral wire.

The device may not comprise an inductor 11, or may not comprise a second voltmeter 15 or a third voltmeter 30. The values adopted for the first and for the second capacitors may be modified according to the current frequency ranges of the network and the current frequency ranges of the expected interferers on this network. The current injection frequencies used in the current generator 8 may be adapted, for keeping these frequencies away from the frequencies expected for the parasitic currents emitted by the interferers 12. If the expected interferer 12 operates instead in a frequency domain substantially lower than the frequencies used in the current generator 8, the capacitor 20 in the third branch may be replaced by a low value inductor, e.g. of a value between 1 and 10 mH.

Other additional resistors, capacitors, inductors may be provided in the device, in addition to the components already mentioned.

The invention claimed is:

1. A device for measuring a ground resistance of an apparatus comprising:
   a current source and an ammeter arranged on a first electrical branch and configured to connect a phase of a power supply network with a ground of the apparatus;
   a second electrical branch configured to connect a neutral wire of the power supply network with the ground of the apparatus, the second electrical branch having a resistor having terminals at which a voltmeter is connected, and a first capacitor in series with the resistor;
   a third electrical branch configured to connect the neutral wire of the network with the ground of the apparatus, the third electrical branch having, in parallel with the first capacitor and the resistor, a second capacitor of higher value than the first capacitor.

2. The device as claimed in claim 1, further comprising:
   an inductor in series with the resistor and with the first capacitor, and parallel to the second capacitor.

3. The device as claimed in claim 2, wherein the inductor has a value between 1 and 10 mH.

4. The device as claimed in claim 1, wherein the second capacitor is at least five times greater than the first capacitor, or at least ten times greater than the first capacitor.

5. The device as claimed in claim 1, wherein the second capacitor has a value between 10 and 100 nF, or between 20 and 300 nF.

6. A charger for a motor vehicle battery, comprising:
   a device as claimed in claim 1.

7. The charger as claimed in claim 6, further comprising:
   a relay configured to connect the second electrical branch alternately to a first connecting terminal of the apparatus, and a second connecting terminal of the apparatus distinct from the first terminal, including a second voltmeter connected between a ground connection terminal and the first connecting terminal and configured to be disconnected by the relay, and including a third voltmeter connected between the ground connection terminal and the second connecting terminal and configured to be disconnected by the relay.

8. The charger as claimed in claim 7, further comprising:
   an electronic control unit configured to switch, when the terminals are connected onto a power supply network, the relay so that the second electrical branch is connected to that of the two terminals for which a voltage measured at the terminals of the second capacitor is lowest.

9. The charger as claimed in claim 8, wherein the electronic control unit is configured to prevent charging following an attempt to connect to the power supply network, if a voltage measured at the terminals of the resistor remains higher than a threshold voltage after activation of the relay.

10. The charger as claimed in claim 6, further comprising:
    an electronic control unit configured to prevent charging if a ground resistance calculated from readings of the ammeter and the first voltmeter is greater than or equal to a threshold resistance.

\* \* \* \* \*